United States Patent
Lee et al.

(10) Patent No.: US 12,324,277 B2
(45) Date of Patent: Jun. 3, 2025

(54) NITRIDE SEMICONDUCTOR LIGHT EMITTING DEVICE AND DISPLAY DEVICE USING THE SAME

(71) Applicant: SAMSUNG ELECTRONICS CO., LTD., Suwon-si (KR)

(72) Inventors: Donggun Lee, Hwaseong-si (KR); Jonguk Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 843 days.

(21) Appl. No.: 17/371,286

(22) Filed: Jul. 9, 2021

(65) Prior Publication Data

US 2022/0140189 A1 May 5, 2022

(30) Foreign Application Priority Data

Oct. 30, 2020 (KR) .................. 10-2020-0143487

(51) Int. Cl.
*H10H 20/825* (2025.01)
*H10H 20/815* (2025.01)
*H10H 20/831* (2025.01)
*H10H 29/14* (2025.01)

(52) U.S. Cl.
CPC ........ *H10H 20/825* (2025.01); *H10H 20/815* (2025.01); *H10H 20/8312* (2025.01); *H10H 29/142* (2025.01)

(58) Field of Classification Search
CPC .............. H10H 20/825; H10H 20/815; H10H 20/8312; H10H 29/142; H10H 20/84; H10H 20/821; H10H 20/819; H01L 25/0753; H10D 86/40
See application file for complete search history.

(56) References Cited

U.S. PATENT DOCUMENTS

| 6,372,608 | B1 | 4/2002 | Shimoda et al. |
| 6,645,830 | B2 | 11/2003 | Shimoda et al. |
| RE38,466 | E | 3/2004 | Inoue et al. |

(Continued)

FOREIGN PATENT DOCUMENTS

EP   1536488 A1   12/2018

OTHER PUBLICATIONS

Office Action issued on Apr. 11, 2025 by the German Patent Office in German Patent Application No. 102021123846.3.

*Primary Examiner* — Su C Kim
(74) *Attorney, Agent, or Firm* — Sughrue Mion, PLLC

(57) ABSTRACT

A nitride semiconductor light emitting device includes: a semiconductor laminate having a first conductivity-type semiconductor layer and a lattice buffer layer in which InGaN layers and GaN layers are alternately stacked, the semiconductor laminate having a columnar body portion protruding through etching of a peripheral region, an insulating layer covering the semiconductor laminate and having an opening at an upper surface of the body portion, and a light emitting structure including a second conductivity-type semiconductor disposed on the upper surface the body portion and selectively grown in the lattice buffer layer to have a side surface inclined with respect to the upper surface of the body portion, an active layer covering the second conductive semiconductor layer, and a third conductivity-type semiconductor layer covering the active layer and contacting the insulating layer.

20 Claims, 12 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,030,680 B2 | 10/2011 | Kim |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,541,794 B2 | 9/2013 | Nagahama et al. |
| 8,735,931 B2 | 5/2014 | Han et al. |
| 8,766,295 B2 | 7/2014 | Kim |
| 10,002,928 B1 | 6/2018 | Raring et al. |
| 10,629,689 B1 | 4/2020 | Raring et al. |
| 2002/0117677 A1* | 8/2002 | Okuyama ............... H01L 33/24 257/94 |
| 2006/0166478 A1* | 7/2006 | Sugahara ............ H01S 5/32341 257/103 |
| 2007/0057276 A1 | 3/2007 | Kiyoku et al. |
| 2018/0269253 A1 | 9/2018 | Sotta et al. |
| 2019/0088820 A1* | 3/2019 | Danesh ................... H01L 33/62 |

\* cited by examiner

NITRIDE SEMICONDUCTOR LIGHT EMITTING DEVICE AND DISPLAY DEVICE USING THE SAME

CROSS-REFERENCE TO RELATED APPLICATION(S)

This application claims benefit of priority to Korean Patent Application No. 10-2020-0143487 filed on Oct. 30, 2020 in the Korean Intellectual Property Office, the disclosure of which is incorporated herein by reference in its entirety.

BACKGROUND

Example embodiments of the present disclosure relate to a nitride semiconductor light emitting device and a display device using the same.

Semiconductor light-emitting diodes (LEDs) have been used as light sources for lighting devices, as well as light sources for various electronic products. In particular, semiconductor LEDs have commonly been used as light sources for the display panels of various devices, such as televisions (TVs), mobile phones, personal computers (PCs), laptop computers, and personal digital assistants (PDAs).

Display devices of the related art contain display panels mainly including a liquid crystal display (LCD) and a backlight. Recently, however, display devices, not requiring separate backlights, and using LED devices as individual pixels have been developed. Such display devices may not only be compact, but may also implement a relatively high luminance display having greater light efficiency, as compared to an LCD of the related art. In addition, since the aspect ratio of a display screen may be freely changed and may be implemented to have a large area, such display devices may be provided as various types of large displays.

SUMMARY

Example embodiments a nitride semiconductor light emitting device with reduced manufacturing costs and which is easily miniaturized, and a display device using the same.

According to an aspect of an example embodiment, there is provided a nitride semiconductor light emitting device including a semiconductor laminate including a first conductivity-type semiconductor layer and a lattice buffer layer disposed on the first conductivity-type semiconductor layer and including InGaN layers and GaN layers that are alternately stacked, the semiconductor laminate having a first surface provided by the first conductivity-type semiconductor layer and a second surface opposed to the first surface, each of the first surface and the second surface extending in a horizontal direction, the semiconductor laminate having a body portion having a columnar shape, and extending from the second surface in a vertical direction; an insulating layer covering the second surface and having an opening at an upper surface of the body portion; and a light emitting structure including a second conductivity-type semiconductor layer disposed on the upper surface of the body portion, the second conductivity-type semiconductor layer being a selective growth on the lattice buffer layer and having a side surface inclined with respect to the upper surface of the body portion, an active layer covering the second conductivity-type semiconductor layer and contacting the insulating layer, and a third conductivity-type semiconductor layer covering the active layer and contacting the insulating layer.

According to an aspect of an example embodiment, there is provided a nitride semiconductor light emitting device including: a semiconductor laminate having a body portion having a columnar shape protruding from a central region, the body portion including a first conductivity-type semiconductor layer and a lattice buffer layer disposed on the first conductivity-type semiconductor layer; an insulating layer covering a side surface and a portion of an upper surface of the body portion and having an opening at the upper surface of the body portion; and a light emitting structure including a second conductivity-type semiconductor layer disposed on the upper the body portion, the second conductivity-type semiconductor layer being a selective growth on the lattice buffer layer through the opening of the insulating layer and having a side surface inclined with respect to the upper surface of the body portion, an active layer covering the second conductivity-type semiconductor layer and contacting the insulating layer, and a third conductivity-type semiconductor layer covering the active layer and contacting the insulating layer, wherein the active layer is configured to emit a red light in a wavelength range of 600 nm to 700 nm.

According to an aspect of an example embodiment, there is provided a display device including: a display panel including a circuit board and a plurality of pixels arranged in rows and columns on the circuit board; and a panel driving unit configured to drive the display panel, wherein each pixel of the plurality of pixels includes a plurality of nitride semiconductor light emitting devices, each nitride semiconductor light emitting device of the plurality of nitride semiconductor light emitting devices including a semiconductor laminate including a first conductivity-type semiconductor layer and a lattice buffer layer disposed on the first conductivity-type semiconductor layer and including InGaN layers and GaN layers that are alternately stacked, the semiconductor laminate having a first surface provided by the first conductivity-type semiconductor layer and a second surface opposed to the first surface, each of the first surface and the second surface extending in a horizontal direction, the semiconductor laminate having a body portion having a columnar shape extending from the second surface in a vertical direction; an insulating layer covering the second surface and having an opening at an upper surface of the body portion; and a light emitting structure including a second conductivity-type semiconductor layer disposed on the upper surface of the body portion, the second conductivity-type semiconductor layer being a selective growth on the lattice buffer layer and having a side surface inclined with respect to the upper surface of the body portion, an active layer covering the second conductivity-type semiconductor layer and contacting the insulating layer, and a third conductivity-type semiconductor layer covering the active layer and contacting the insulating layer, the plurality of nitride semiconductor light emitting devices constitute a plurality of sub-pixels of the pixel; a molding portion surrounding each side surface of the plurality of nitride semiconductor light emitting devices such that the plurality of nitride semiconductor light emitting devices are coupled; and a first electrode and a second electrode connected to the first conductivity-type semiconductor layer and the third conductivity-type semiconductor layer, respectively, the first electrode and the second electrode penetrating through the molding portion.

BRIEF DESCRIPTION OF DRAWINGS

The above and other aspects, features, and advantages of certain example embodiments will be more clearly understood from the following detailed description, taken in conjunction with the accompanying drawings, in which.

DETAILED DESCRIPTION

Hereinafter, example embodiments will be described with reference to the accompanying drawings.

Figure 1:
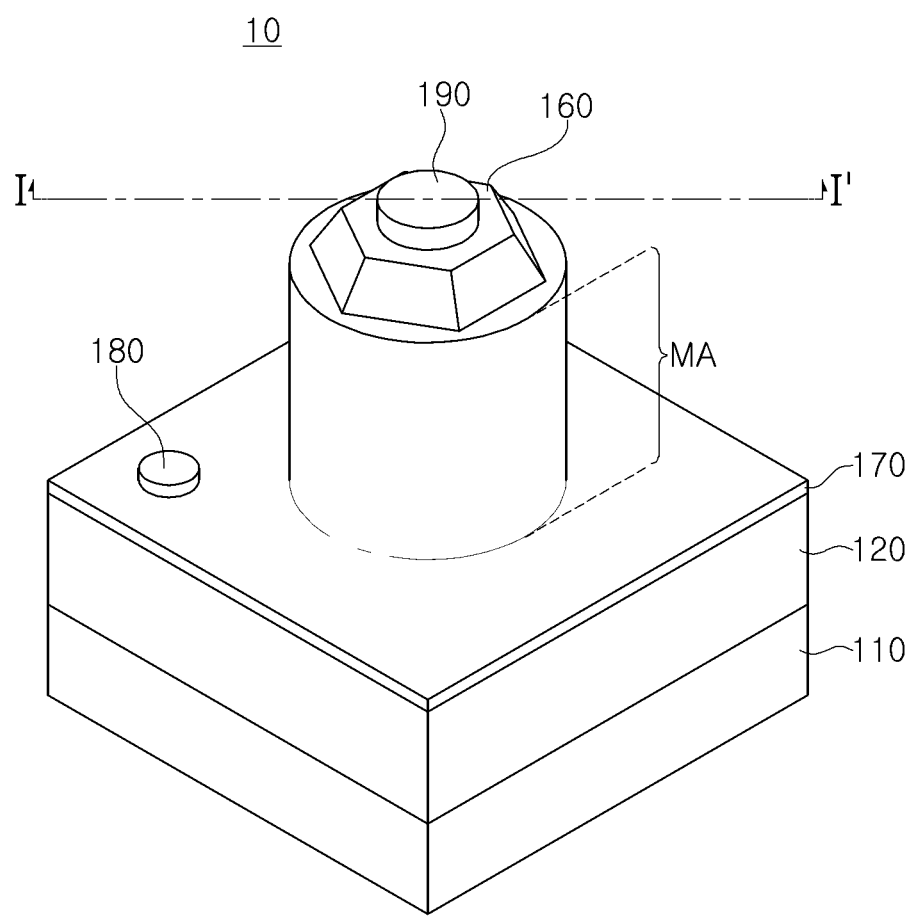
FIG. 1 is a schematic perspective view of a nitride semiconductor light emitting device according to an example embodiment.

A nitride semiconductor light emitting device according to an example embodiment will be described with reference to FIGS. 1 and 2. FIG. 1 is a schematic perspective view of a nitride semiconductor light emitting device according to an example embodiment, and FIG. 2 is a side cross-sectional view taken along line II' of FIG. 1.

Figure 2:
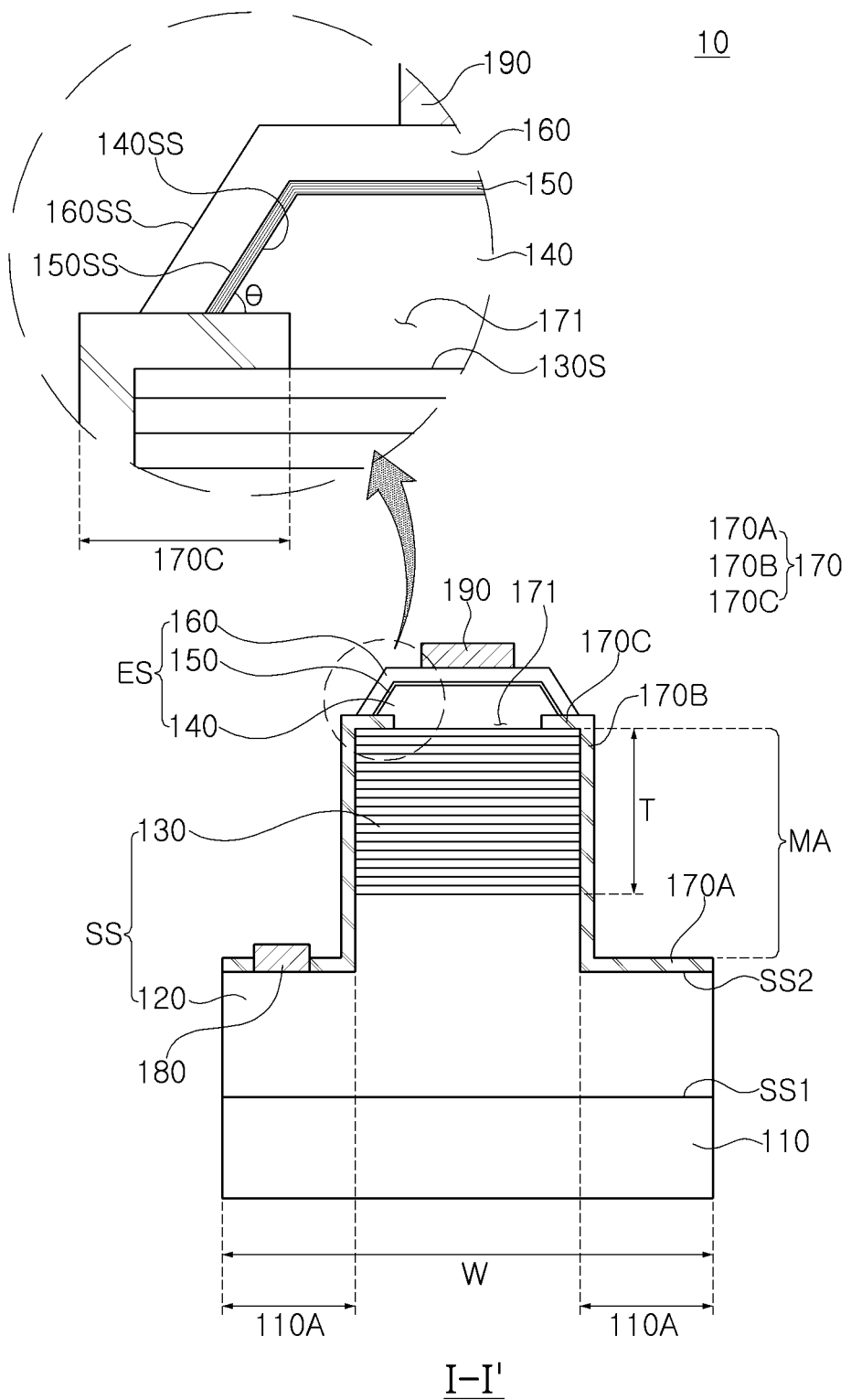
FIG. 2 is a side cross-sectional view taken along line I-I' of FIG. 1.

Referring to FIGS. 1 and 2, a nitride semiconductor light emitting device 10 according to an example embodiment may include a substrate 110, a semiconductor laminate SS, an insulating layer 170, a light emitting structure ES, a first electrode 180 and a second electrode 190.

The substrate 110 is a growth substrate for growing a nitride semiconductor layer. The substrate 110 may be formed of sapphire, Si, SiC, $MgAl_2O_4$, MgO, $LiAlO_2$, $LiGaO_2$, GaN, AN, a metal material, and the like. Sapphire, widely used as a substrate for nitride semiconductor growth, is a crystal having electrically insulating properties and Hexa-Rhombo R3c symmetry, having a lattice constant in a direction of a C-axis and an A-axis of 13.001 Å and 4.758 Å, respectively, and having a C (0001) plane, an A(11-20) plane, and an R(1-102) plane. In this case, the C-plane is mainly used as a substrate for nitride growth because it is relatively easy to grow a nitride thin film thereon and is stable at high temperatures. However, the substrate 110 may be removed after growing the nitride semiconductor layer, depending on the example embodiment.

The semiconductor laminate SS may include a first conductivity-type semiconductor layer 120 and a lattice buffer layer 130 sequentially stacked on the substrate 110. A central region of the semiconductor laminate SS may have a protruding body portion MA. A first surface SS1 of the semiconductor laminate SS may be provided as a surface in contact with the substrate 110, and the body portion MA may be disposed on a second surface SS2 disposed in a direction opposite to the first surface SS1. In some embodiments, the first conductivity-type semiconductor layer 120 may include first surface SS1 below and second surface SS2 above, with SS2 opposed to the first surface SS1 (see FIG. 2). In some embodiments, the first surface SS1 and the second surface SS2 may each extend in a horizontal direction as shown in FIG. 2. In some embodiments, the semiconductor laminate SS with body portion MA may extend in a vertical direction (see, for example, FIG. 2).

The body portion MA may have a side surface of a cylindrical column or a polygonal column. In an example embodiment, a case in which the body portion MA has a cylindrical columnar side surface will be described as an example. The body part MA may have a structure in which a lattice buffer layer 130 is disposed on the first conductivity-type semiconductor layer 120. The lattice buffer layer 130 may be disposed on the first conductivity-type semiconductor layer 120 from which a peripheral region 110A has been removed, to relieve a compressive stress of the first conductivity-type semiconductor layer 120 from being applied to the second conductivity-type semiconductor layer 140. An upper surface 130S of the body portion MA may have a flat surface.

The first conductivity-type semiconductor layer 120 may be an n-type semiconductor layer as a buffer layer, and may be formed of a nitride semiconductor. The first conductivity-type semiconductor layer 120 may have a lattice constant, smaller than that of the substrate 110, and may be a nitride semiconductor crystal having a lattice constant, greater than that of the lattice buffer layer 130. The first conductivity-type semiconductor layer 120 may include $Al_xIn_yGa_{1-x-y}N$ (0≤x, y≤1, x+y<1). For example, the lattice constant of the first conductivity-type semiconductor layer 120 may be 3.189 Å.

The lattice buffer layer 130 may be a buffer layer for alleviating a difference in lattice constants between the first conductivity-type semiconductor layer 120 and a light emitting structure ES. The lattice buffer layer 130 may have a super lattice structure in which two or more layers having different compositions are alternately stacked. For example, the lattice buffer layer 130 may be a $Al_{x1}In_{y1}Ga_{1-x1-y1}N/Al_{x2}In_{y2}Ga_{1-x2-y2}N$ (0≤x1, x2, y1, y2≤1, x1≠x2 or y1≠y2, x1+y1≤1, x2+y2≤1) super lattice layer. More specifically, the lattice buffer layer 130 may be an InGaN/GaN super lattice layer. The lattice buffer layer 130 may adopt a super lattice structure, so that stress between the first conductivity-type semiconductor layer 120 and the second conductivity-type semiconductor layer 140 of the light emitting structure ES can be effectively relieved. The light emitting structure ES disposed above the semiconductor laminate SS may include an active layer 150 emitting red light. To this end, the active layer 150 may be InGaN, for example, the active layer 150 may be $In_{0.35}Ga_{0.65}N$. When the active layer 150 is $In_{0.35}Ga_{0.65}N$, since a lattice constant of the active layer 150 reaches 3.311 Å, it is very difficult to directly form the active layer 150 on the first conductivity-type semiconductor layer 120. In an example embodiment, the lattice buffer layer 130 and the second conductivity-type semiconductor layer 140 may be disposed between the first conductivity-type semiconductor layer 120 and the active layer 150, to alleviate a difference in lattice constants between the first conductivity-type semiconductor layer 120 and the active layer 150. A thickness T of the lattice buffer layer 130 should be sufficiently thick to relieve the stress from being transmitted to the first conductivity-type semiconductor layer 120. In an example embodiment, the lattice buffer layer 130 may be formed to have a thickness T of at least 1/10 or more than the width W of the first conductivity-type semiconductor layer 120.

The insulating layer 170 may be disposed on the second surface SS2 of the semiconductor laminate SS. The insulating layer 170 may be formed of silicon oxide ($SiO_2$) or silicon nitride (SiN$_x$). The insulating layer 170 may be disposed to entirely cover the second surface SS2, but an opening may be disposed in some regions. In an example embodiment, the insulating layer 170 may include a first region 170A covering an upper surface of the first conductivity-type semiconductor layer 120, a second region 170B covering a side surface of the first conductivity-type semiconductor layer 120 and a side surface of the body portion MA, and a third region 170C covering an upper surface 130S of the body portion MA. In addition, an opening 171 may be formed in the third region 170C of the insulating layer 170. Since a bottom surface of the opening 171 corresponds to the upper surface 130S of the body portion MA, the lattice buffer layer 130 may be disposed on the bottom surface of the opening 171. The insulating layer 170 may be used as a mask to limit a region in which the lattice buffer layer 130 of the body portion MA is grown. That is, the lattice buffer layer 130 may be selectively grown only through the opening 171 of the insulating layer 170. Accordingly, the lattice buffer layer 130 may be selectively grown above the body portion MA through the opening 171 to form the second conductivity-type semiconductor layer 140. In addition, the opening 171 may determine an initial crystal shape of the second conductivity-type semiconductor layer 140 grown above the lattice buffer layer 130.

In addition, the insulating layer 170 may be disposed to surround the side surface of the lattice buffer layer 130, to act as a support member for preventing the upper surface 130S of the lattice buffer layer 130 from being excessively expanded in a process in which the lattice buffer layer 130 lattice matches the first conductivity-type semiconductor layer 120 and the second conductivity-type semiconductor layer 140 to each other. To this end, the insulating layer 170 may be formed to have a thickness, sufficient to induce selective growth of the second conductivity-type semiconductor layer 140. In an example embodiment, the insulating layer 170 may be formed to a thickness of 9 nm to 11 nm.

A light emitting structure ES may be disposed above the semiconductor laminate SS. The light emitting structure may have a structure in which the second conductivity-type semiconductor layer 140, the active layer 150, and the third conductivity-type semiconductor layer 160 are sequentially stacked. The second and third conductivity-type semiconductor layers 140 and 160 may be n-type and p-type semiconductor layers, respectively, and may be formed of nitride semiconductors. Accordingly, although not limited thereto, in an example embodiment, the second and third conductivity-type semiconductor layers 140 and 160 may be made of a nitride semiconductor, for example GaN, having an Al$_x$In$_y$Ga$_{(1-x-y)}$N composition formula (here, 0≤x<1, 0≤y<1, and 0≤x+y<1). The second conductivity-type semiconductor layer 140 may be made of a material having the same composition as the first conductivity-type semiconductor layer 120.

The second conductivity-type semiconductor layer 140 may be formed by selectively growing the lattice buffer layer 130 through the opening 171 of the insulating layer 170. The second conductivity-type semiconductor layer 140 may have a shape of a hexagonal column, and each side surface 140SS thereof may be formed as an inclined surface. At least a portion of the side surfaces 140SS of the second conductivity-type semiconductor layer 140 may be a crystal plane naturally formed in the process of selectively growing the lattice buffer layer 130. For example, when the second conductivity-type semiconductor layer 140 is formed of GaN, the side surface 140SS of the second conductivity-type semiconductor layer 140 may be a semi-polar surface, and may have an inclination angle θ of 55° to 65° with respect to the upper surface 130S of the body portion MA. The side surface 140SS of the second conductivity-type semiconductor layer 140 may be disposed to contact the third region 170C of the insulating layer 170 disposed above the body portion MA. That is, the second conductivity-type semiconductor layer 140 may be formed so as not to deviate from the upper surface 130S of the body portion MA, while covering the opening 171 of the insulating layer 170.

The active layer 150 and the third conductivity-type semiconductor layer 160 may be conformally stacked on a surface of the second conductivity-type semiconductor layer 140. Accordingly, a side surface 150SS of the active layer 150 and a side surface 160SS of the third conductivity-type semiconductor layer 160 may be formed of a semi-polar surface in the same manner as the side surface 140SS of the second conductivity-type semiconductor layer 140. In addition, the side surface 150SS of the active layer 150 and the side surface 160SS of the third conductivity-type semiconductor layer 160 may be disposed to contact the third region 170C of the insulating layer 170. Accordingly, the third conductivity-type semiconductor layer 160 may be formed so as not to deviate from the upper surface 130S of the body portion MA.

The active layer 150 may have a multiple quantum well (MQW) structure in which a quantum well layer and a quantum barrier layer are alternately stacked with each other. For example, the quantum well layer and the quantum barrier layer may be formed of In$_x$Al$_y$Ga$_{1-x-y}$N (0≤x≤1, 0≤y≤1, 0≤x+y≤1) having different compositions. In an example embodiment, the quantum well layer and the quantum barrier layer may be expressed by the composition formula of In$_x$Ga$_{(1-x)}$N, In$_y$Ga$_{(1-y)}$N (0<x<1, 0<y<1, y<x), respectively. The structure of the active layer 150 may not be limited to a multiple quantum well structure, and may have a single quantum well structure. As mentioned above, it is known that it is very difficult to emit red light using the InGaN-based active layer 150, mainly because a difference in lattice constants between GaN forming the conductivity-type semiconductor layer and InGaN forming the active layer is significantly large, so that a lattice match is difficult. When the composition of the InGaN-based active layer 150 for emitting red light is In$_{0.35}$Ga$_{0.65}$N, while the lattice constant of GaN is 3.189 Å, the lattice constant thereof may reach 3.311 Å. Accordingly, it was substantially difficult to emit red light using the InGaN-based active layer 150. In an example embodiment, by alleviating a difference in lattice constants between the first conductivity-type semiconductor layer 120 and the active layer 150, by disposing the lattice buffer layer 130 and the second conductivity-type semiconductor layer 140 between the first conductivity-type semiconductor layer 120 and the active layer 150, the InGaN-based active layer can emit red light. Accordingly, the light emitting structure ES according to an example embodiment may emit red light of 600 nm to 700 nm without a separate wavelength conversion material.

First and second electrodes 180 and 190 may be disposed on the first conductivity-type semiconductor layer 120 and the third conductivity-type semiconductor layer 160, respectively. The first and second electrodes 180 and 190 may be for applying external power to the first and third conductivity-type semiconductor layers 120 and 160, respectively, and may be provided to form an ohmic connection with the first and third conductivity-type semiconductor layers 120 and 160, respectively.

The first and second electrodes 180 and 190 may be formed as a single layer or a multilayer structure of a conductive material having ohmic connection characteristics with the first and third conductivity-type semiconductor layers 120 and 160, respectively. For example, the first and second electrodes 180 and 190 may be formed by a process of depositing or sputtering one or more of materials such as Au, Ag, Cu, Zn, Al, In, Ti, Si, Ge, Sn, Mg, Ta, Cr, W, Ru, Rh, Ir, Ni, Pd, Pt, and transparent conductive oxide (TCO).

In the nitride semiconductor light emitting device 10 of this configuration, the lattice buffer layer 130 may be disposed on the first conductivity-type semiconductor layer 120, and the lattice buffer layer 130 may be formed in a protruding columnar shape, thereby implementing an InGaN-based active layer emitting red light. Since such a semiconductor light emitting device having an InGaN-based active layer can be produced by applying it to a 200 nm to 300 mm wafer, it can be produced at a lower manufacturing cost compared to a conventional AlInGaP-based red semiconductor light emitting device or a semiconductor light emitting device using red phosphor. In addition, a semiconductor light emitting device having an InGaN-based active layer can manufacture an ultra-fine semiconductor light emitting device having a very narrow width compared to a conventional AlInGaP-based red semiconductor light emitting device or the semiconductor light emitting device using a red phosphor. Therefore, it is possible to manufacture a high-resolution display of 5000 PPI or more using the same.

Figure 3:
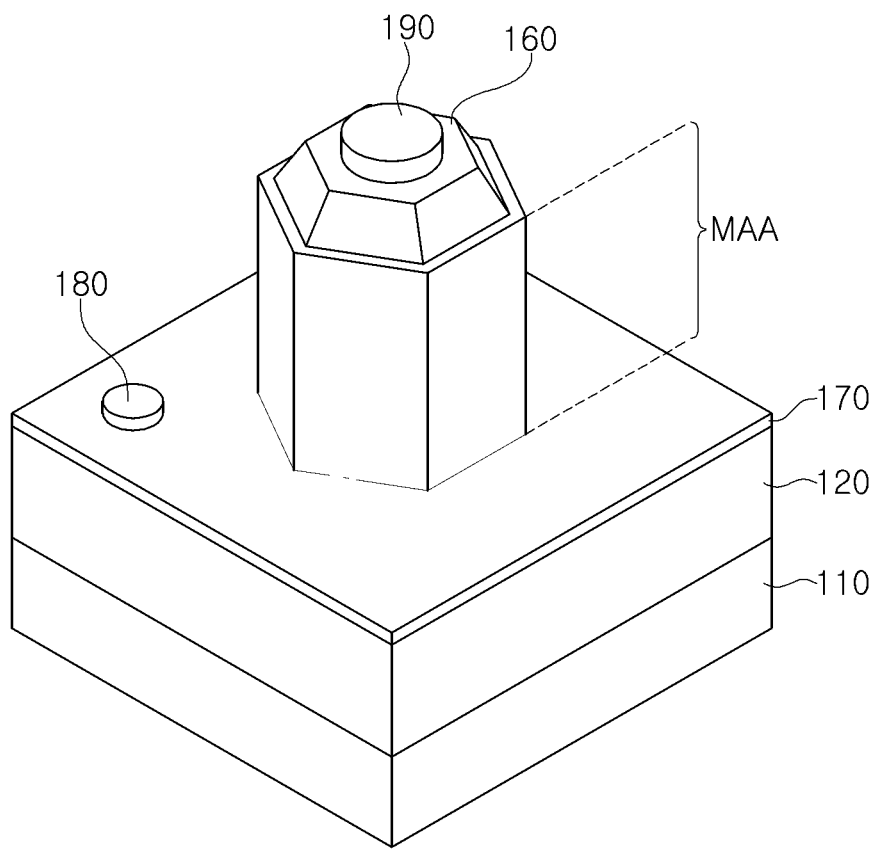
FIGS. 3 and 4 are modified examples of a nitride semiconductor light emitting device according to an example embodiment.
Figure 4:
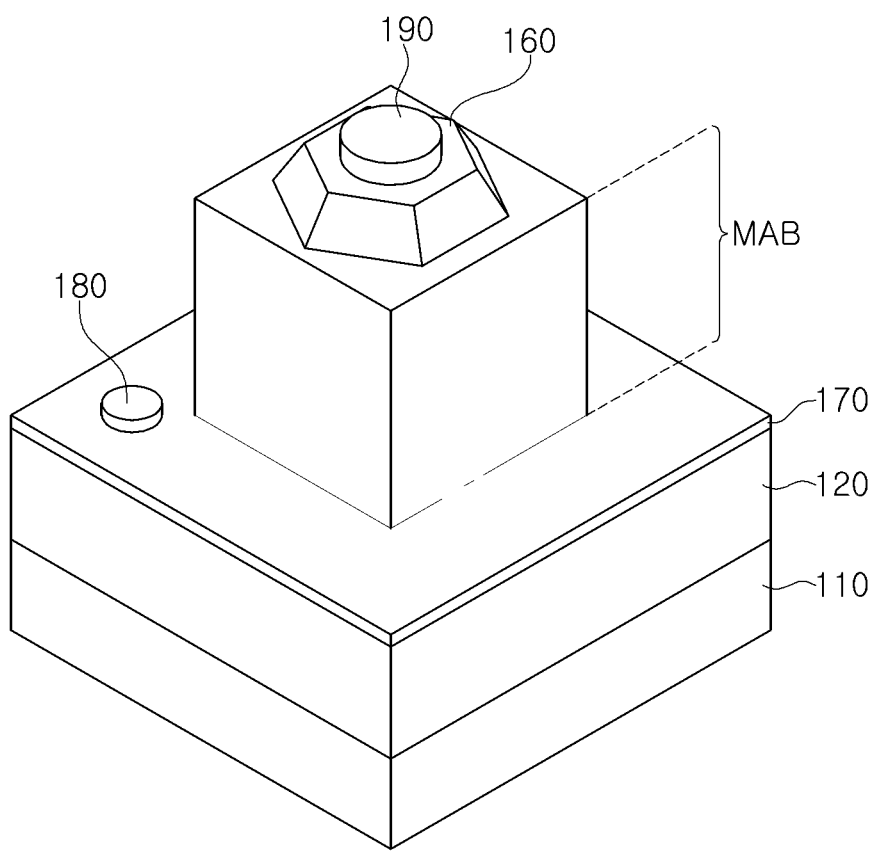

FIGS. 3 and 4 illustrate modified examples in which the shape of the body portion is modified. Configurations, other than the body portion are the same as those of the example embodiments described above, so a detailed description of the same configuration is omitted.

A nitride semiconductor light emitting device 20 of FIG. 3 illustrates a case in which a body portion MAA has a hexagonal columnar shape. Each side surface of the body portion MAA may be disposed to correspond to a crystal plane of the lattice buffer layer and the first conductivity-type semiconductor layer constituting the body portion MAA. A nitride semiconductor light emitting device 30 of FIG. 4 illustrates a case in which a body portion MAB has a square columnar shape.

Next, a manufacturing process of the nitride semiconductor light emitting device 10 of FIG. 2 will be described with reference to FIGS. 5 to 12. FIGS. 5 to 12 are views schematically illustrating a main manufacturing process of the nitride semiconductor light emitting device of FIG. 2. The process described later may be performed at a wafer level.

Figure 5:
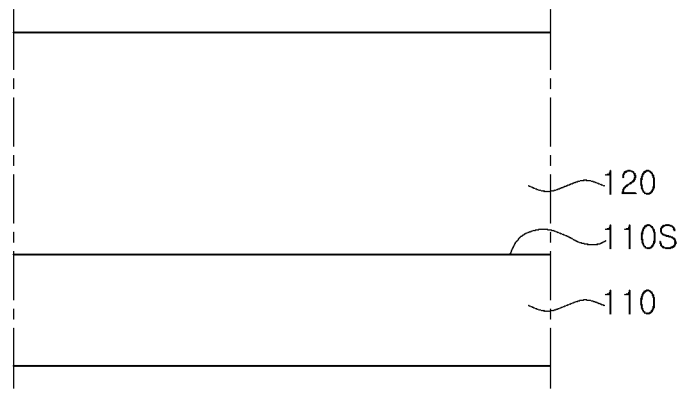
FIGS. 5, 6, 7, 8, 9, 10, 11 and 12 are views schematically illustrating a main manufacturing process of the nitride semiconductor light emitting device of FIG. 2.

First, referring to FIG. 5, a first conductivity-type semiconductor layer 120 may be formed on a substrate 110.

The substrate 110 is a substrate for semiconductor growth, and may be provided as a wafer. The growth substrate GS may use insulating, conductive, and semiconductor materials such as sapphire, SiC, $MgAl_2O_4$, MgO, $LiAlO_2$, $LiGaO_2$, GaN, and the like. The first conductivity-type semiconductor layer 120 may be formed by being grown from a front surface 110S of the substrate 110. The first conductivity-type semiconductor layer 120 may be formed of a semiconductor layer doped with n-type impurities, and may be an n-type nitride semiconductor layer.

Figure 6:
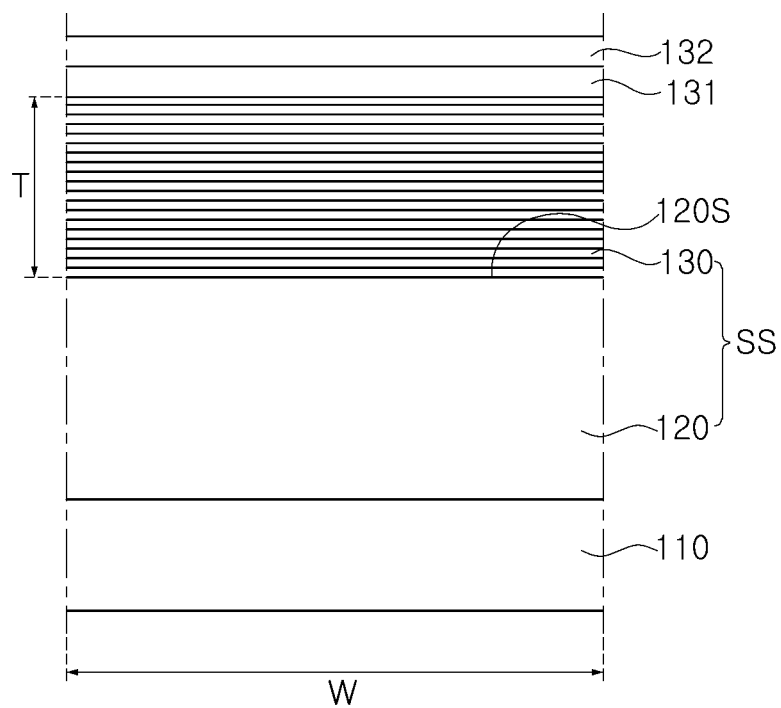

Next, referring to FIG. 6, a semiconductor laminate SS including a lattice buffer layer 130 may be formed on the front surface 120S of the first conductivity-type semiconductor layer 120. First and second masking layers 131 and 132 may be sequentially stacked on the semiconductor laminate SS.

The lattice buffer layer 130 may be disposed to alleviate a difference in lattice constants between the second conductivity-type semiconductor layer 140 and the first conductivity-type semiconductor layer 120 to be described later. A thickness T of the lattice buffer layer 130 may be formed to be sufficiently thick to alleviate the transfer of the stress of the first conductivity-type semiconductor layer 120. In an example embodiment, the lattice buffer layer 130 may be formed to have a thickness T of at least 1/10 or more than the width W of the first conductivity-type semiconductor layer 120.

The first and second masking layers 131 and 132 may be formed of insulating materials having different etching selectivity. For example, the first masking layer 131 may be made of silicon oxide ($SiO_2$) and the second masking layer 132 may be made of silicon nitride ($SiN_x$), and conversely, the first masking layer 131 may be made of silicon nitride ($SiN_x$), and the second masking layer 132 may be made of silicon oxide ($SiO_2$).

Figure 7:
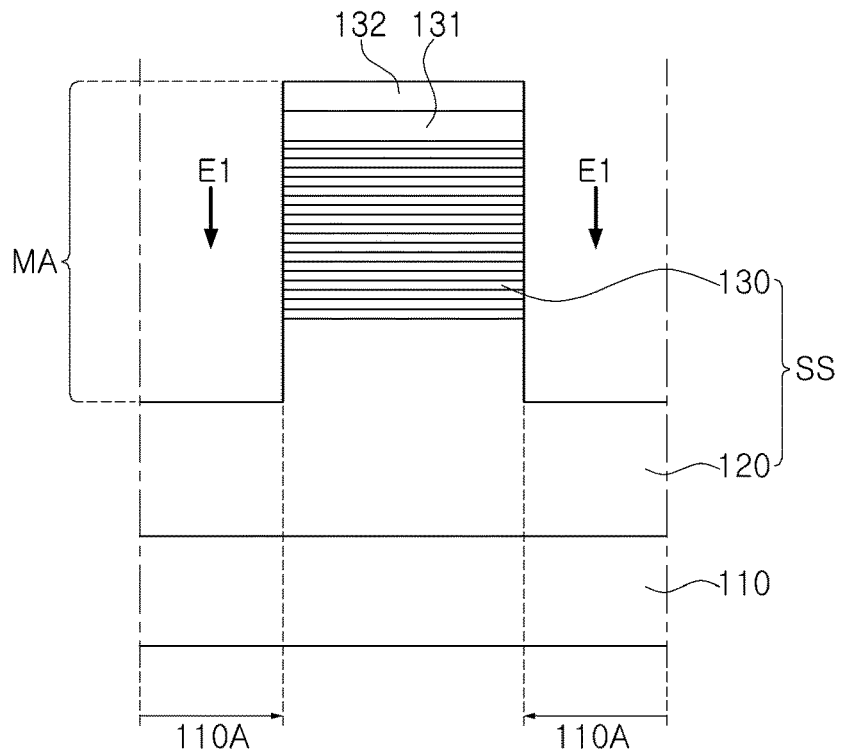

Next, referring to FIG. 7, a body portion MA protruding from the first conductivity-type semiconductor layer 120 may be formed by dry etching E1 the peripheral region 110A of the semiconductor laminate SS.

Figure 8:
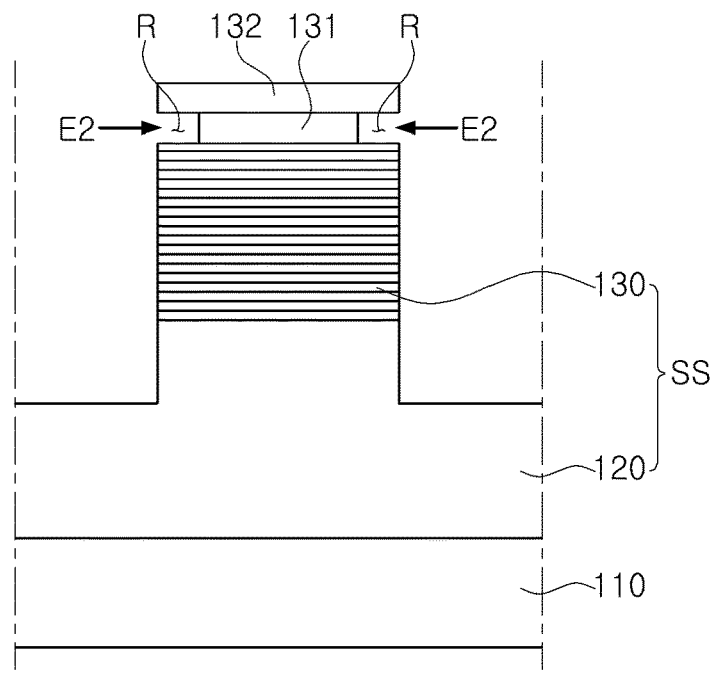

Next, referring to FIG. 8, the first masking layer 131 may be wet-etched E2 to form a recess region R in the peripheral region of the first masking layer 131. When the first masking layer 131 is silicon oxide ($SiO_2$), a wet etching process may be performed with an etching solution containing hydrofluoric acid. In addition, when the first masking layer 131 is made of silicon nitride ($SiN_x$), the process may be performed with an etching solution containing phosphoric acid. Accordingly, the second masking layer 132 may not be etched, and only the first masking layer 131 may be selectively etched.

Figure 9:
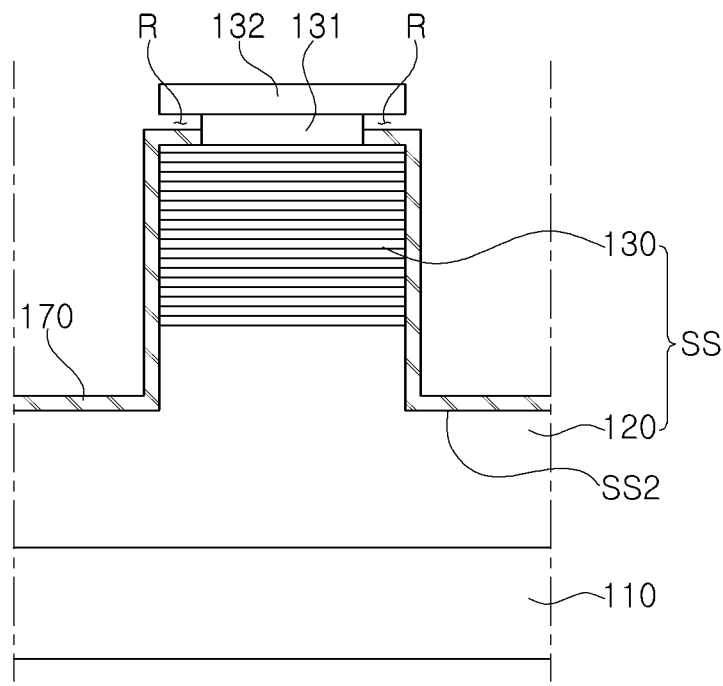

Next, referring to FIG. 9, an insulating layer 170 may be formed so as to entirely cover a second surface SS2 of the semiconductor laminate SS. The insulating layer 170 may be formed of an insulating material having an etching selectivity, different from that of the first masking layer 131. The insulating layer 170 may be formed of the same material as the second masking layer 132, but is not limited thereto. If the insulating layer 170 is formed of a material having an etching selectivity, different from that of the first masking layer 132, it may be formed of a material, different from the second masking layer 132. The insulating layer 170 may be formed up to the recess region R so as to contact the first masking layer 131. The insulating layer 170 may be formed to have a thickness, thinner than the first masking layer 131 so as not to close the recess region R. Accordingly, in a subsequent process, a wet etching solution may be injected through the recess region R to lift off the second masking layer 132.

Figure 10:
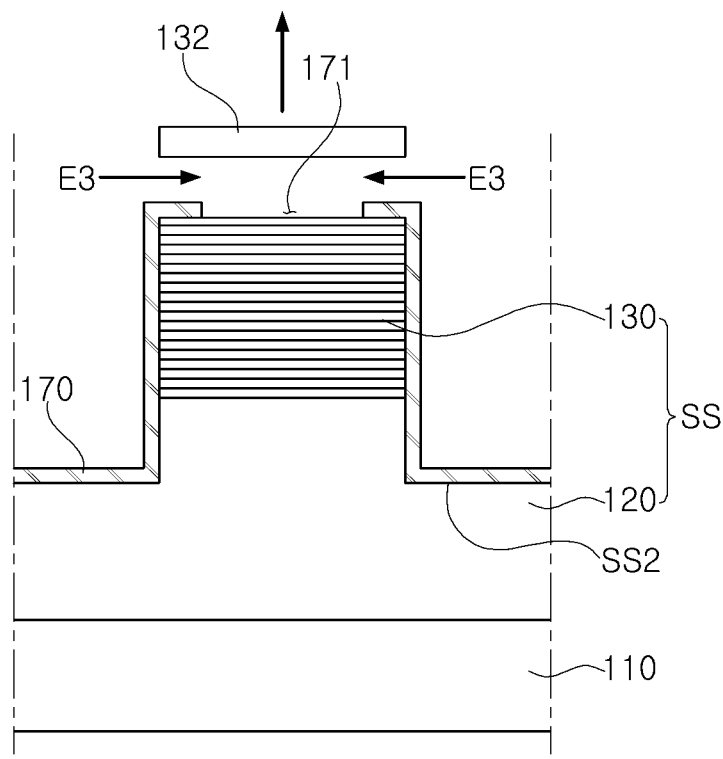

Next, referring to FIGS. 9 and 10, the second masking layer 132 may be lifted off by injecting a wet etching solution into the recess region R to etch E3 the first masking layer 131. When the first masking layer 131 is silicon oxide ($SiO_2$), the wet etching process may be performed with an etching solution containing hydrofluoric acid. In addition, when the first masking layer 131 is made of silicon nitride ($SiN_x$), the process may be performed with an etching solution containing phosphoric acid. Accordingly, the first masking layer 131 may be etched away to be removed, and the second masking layer 132 may be lifted-off. In this process, the opening 171 may be formed by self-aligning in a region of the insulating layer 170 corresponding to the upper portion of the lattice buffer layer 130.

Figure 11:
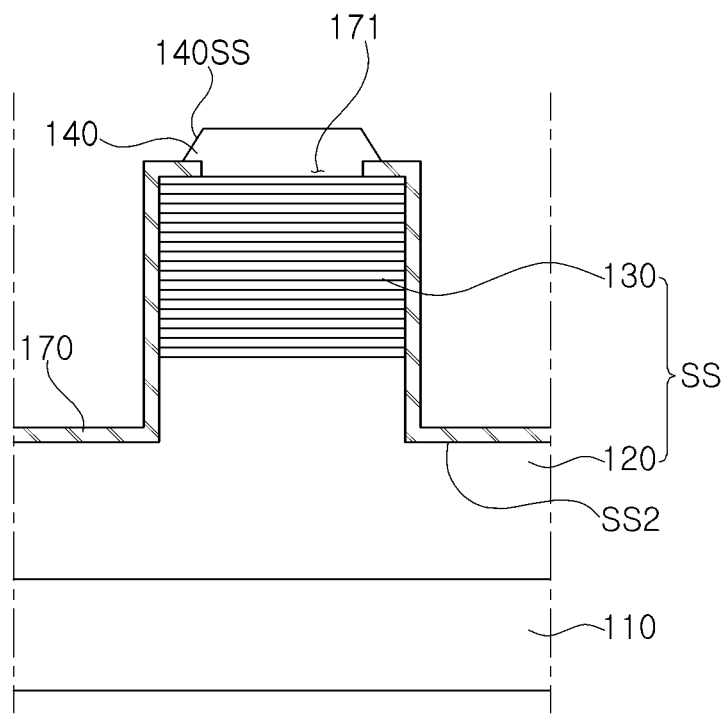

Next, referring to FIG. 11, a second conductivity-type semiconductor layer 140 may be formed by selectively growing the lattice buffer layer 130 through the opening 171.

In a process of selectively growing the lattice buffer layer 130, an inclined side surface 140SS of the second conductivity-type semiconductor layer 140 may be naturally formed.

Figure 12:
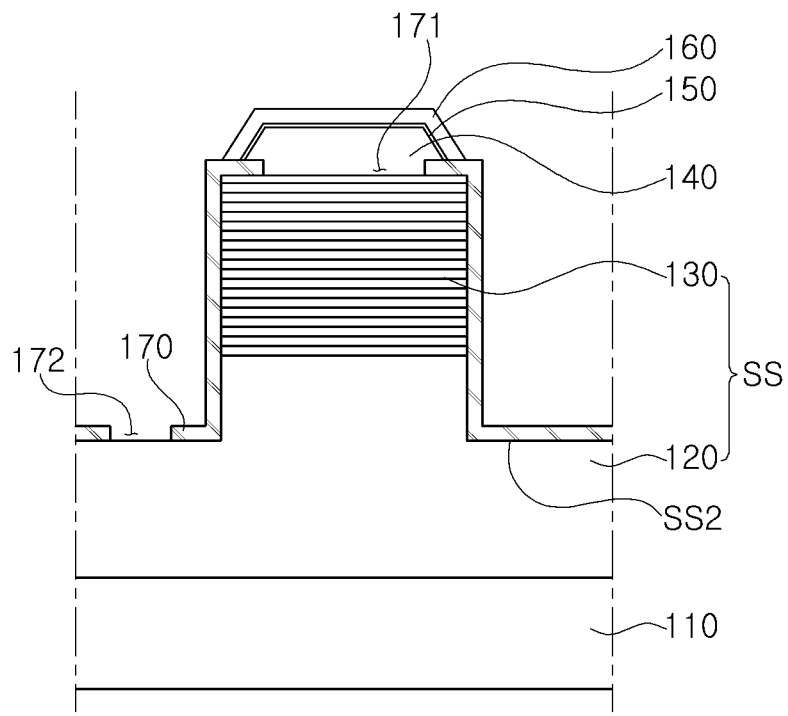

Next, referring to FIG. 12, an active layer 150 and a third conductivity-type semiconductor layer 160 may be conformally formed on the second conductivity-type semiconductor layer 140. In addition, an opening 172 through which the first conductivity-type semiconductor layer 120 is exposed to a bottom surface may be formed in one region of the insulating layer 170. A second electrode 180 may be formed in the opening 172 in a subsequent process. Next, by dicing it in units of individual devices, the nitride semiconductor light emitting device 20 of FIG. 2 can be manufactured.

Figure 13:
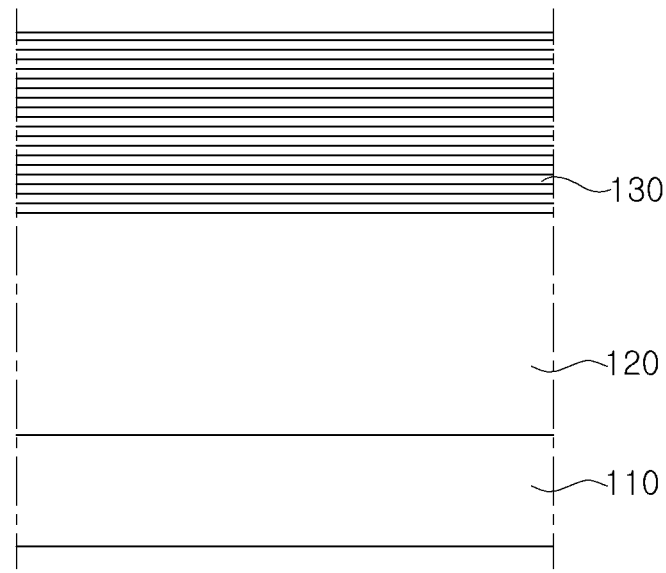
FIGS. 13, 14, 15 and 16 are views schematically illustrating a main manufacturing process of the nitride semiconductor light emitting device of FIG. 2.

Next, a manufacturing process of the nitride semiconductor light emitting device 10 of FIG. 2 will be described with reference to FIGS. 13 to 16. FIGS. 13 to 16 are views schematically illustrating a main manufacturing process of the nitride semiconductor light emitting device of FIG. 2. Since the process prior to FIG. 13 is the same as that of FIG. 5 of the above-described example embodiment, a description thereof is omitted. When compared with FIG. 6 of the example embodiment described above, there is a difference in that the first masking layer 131 and the second masking layer 132 are not formed on the lattice buffer layer 130. This will be mainly described.

Referring to FIG. 13, a lattice buffer layer 130 may be formed on the first conductivity-type semiconductor layer 120.

Figure 14:
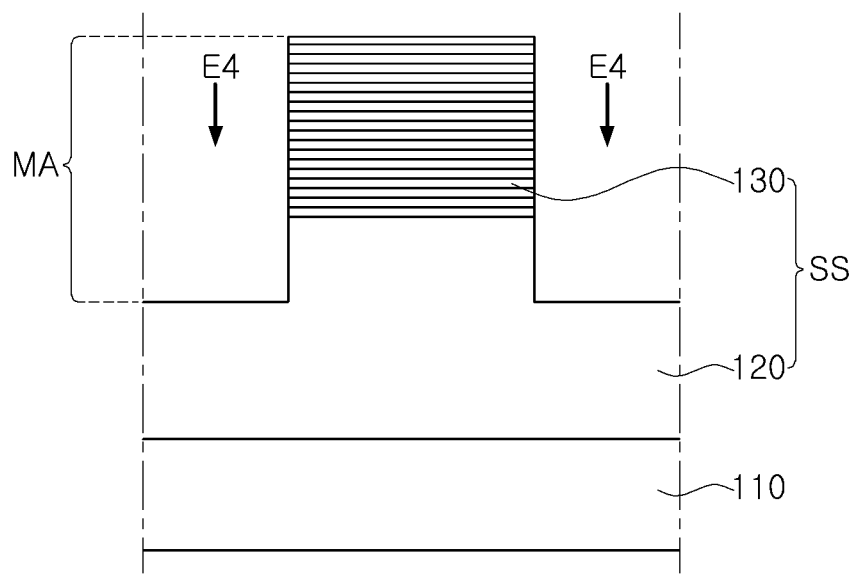

Next, referring to FIG. 14, a body portion MA protruding from the first conductivity-type semiconductor layer 120 may be formed by dry etching E4 a peripheral region of the semiconductor laminate SS.

Figure 15:
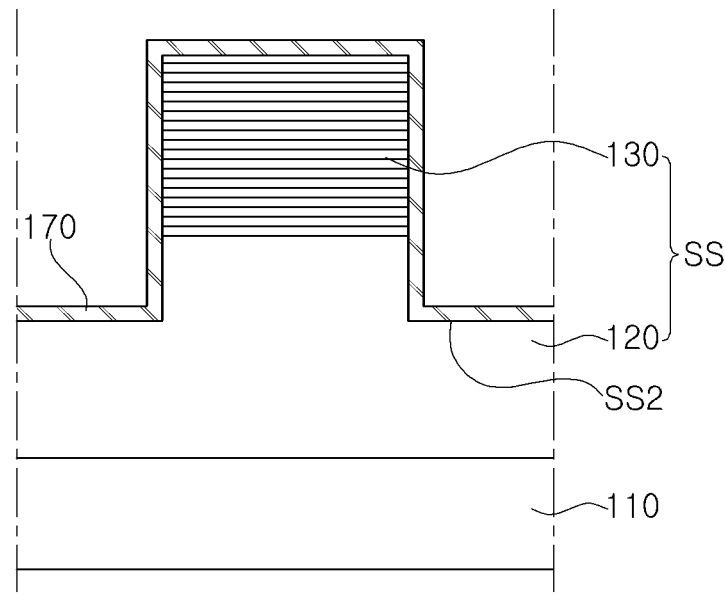
Figure 16:
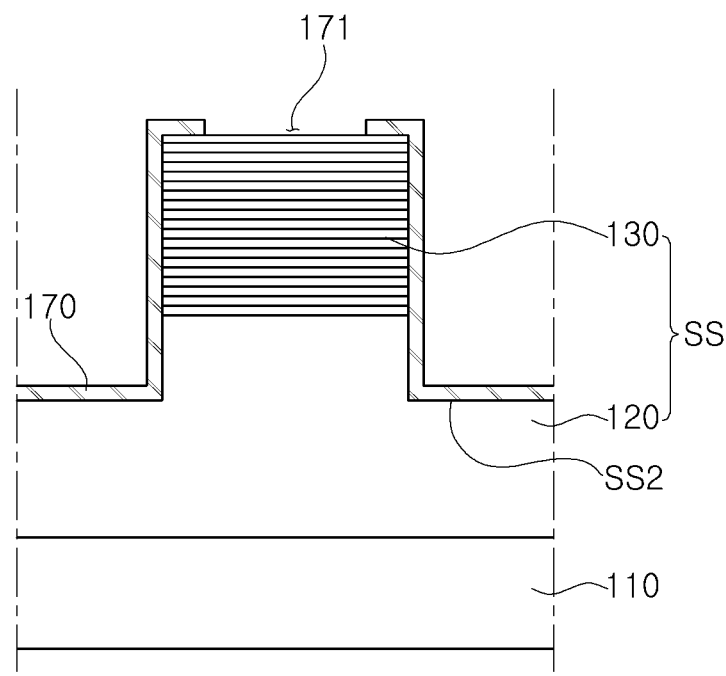

Next, referring to FIG. 15, an insulating layer 170 may be formed so as to entirely cover the second surface S S2 of the semiconductor laminate SS. Next, referring to FIG. 16, a region of the insulating layer 170 corresponding to the upper portion of the lattice buffer layer 130 may be etched, to form an opening 171. Since the subsequent process is the same as the process after FIG. 11 of the above-described example embodiment, a detailed description thereof will be omitted.

Figure 17:
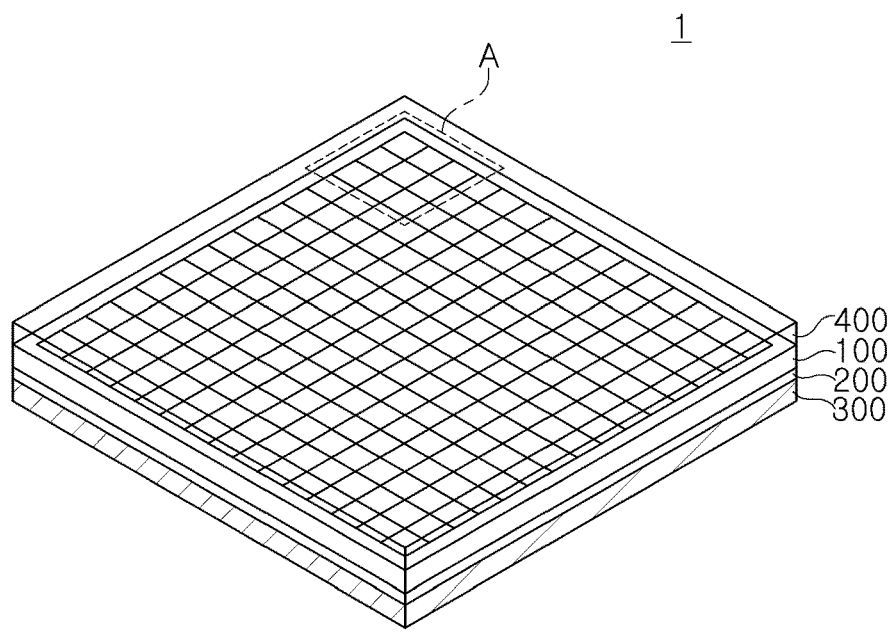
FIG. 17 is a schematic perspective view of a display device employing a nitride semiconductor light emitting device according to an example embodiment.
Figure 18:
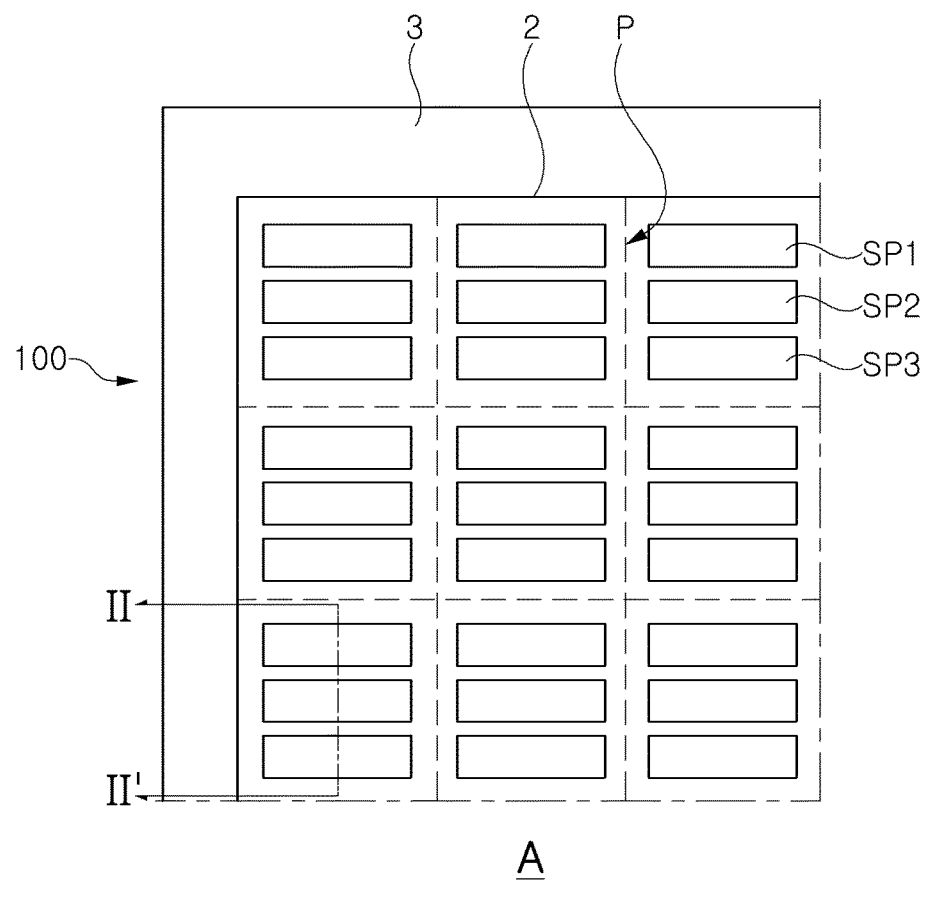
FIG. 18 is a plan view illustrating an enlarged portion 'A' of FIG. 17.
Figure 19:
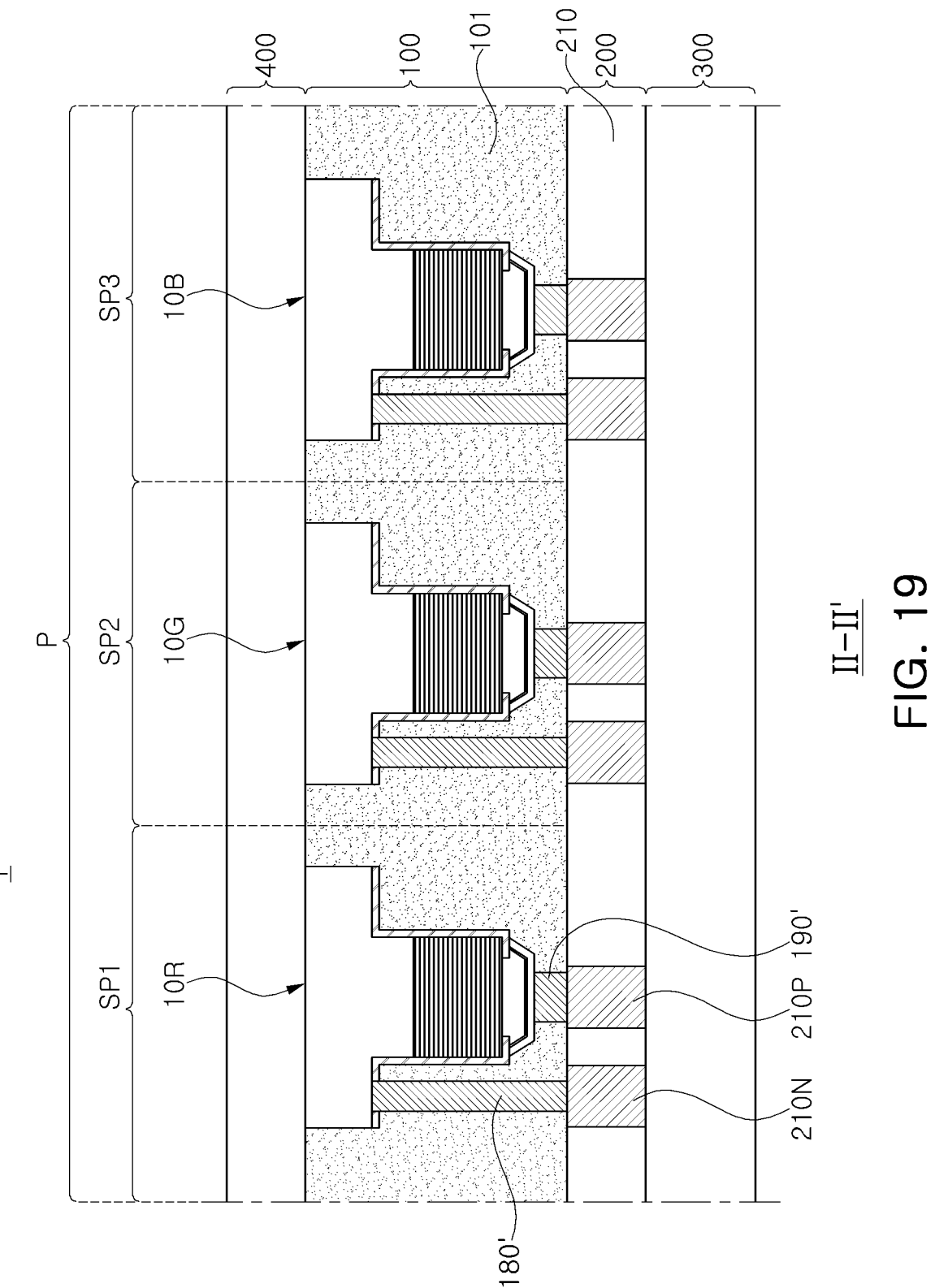
FIG. 19 is a side cross-sectional view taken along line II-II' of FIG. 18.

A display device according to an example embodiment will be described with reference to FIGS. 17 to 19. FIG. 17 is a schematic perspective view of a display device employing a nitride semiconductor light emitting device according to an example embodiment. FIG. 18 is a plan view illustrating an enlarged portion 'A' of FIG. 17, and FIG. 19 is a side cross-sectional view taken along line II-II' of FIG. 18.

Referring to FIG. 17, a display device 1 according to an example embodiment may include a first substrate structure 100 made of a nitride semiconductor light emitting device array, and a second substrate structure 300 disposed below the first substrate structure 100 and including a driving circuit. A protective layer 400 may be disposed on an upper surface of the first substrate structure 100, and a bonding layer 200 may be disposed between the first substrate structure 100 and the second substrate structure 300. The display device 1 may have a square substrate shape or other suitable shape. The first substrate structure 100 may be understood as a display panel, and the second substrate structure 300 may be understood as a panel driving unit for driving the display panel. The display device 1 according to an example embodiment may be an ultra-miniaturized display with ultra-high resolution used in a headset for virtual reality or augmented reality.

Referring to FIG. 18, the first substrate structure 100 may include a pixel region 2 and a molding region 3 surrounding the pixel region 2. A plurality of pixels P may be disposed in the pixel region 2 to form a column and a row. A plurality of pixels P according to an example embodiment are illustrated in FIG. 17 as forming a 15×15 rectangular array, but the number of columns and rows may be implemented as any appropriate number (e.g., 1024×768, 1920×1080, 3840×2160, 7680×4320), and may be arranged in various shapes other than a square. The plurality of pixels P may be connected to each other. That is, the plurality of pixels P may not be separately manufactured, but may be entirely manufactured at once in the same process. The pixel P according to an example embodiment may be manufactured to have a pixel density of 5000 pixels per inch (PPI) or more.

The molding region 3 may be disposed around the pixel region 2. The molding region 3 may include a black matrix. For example, the black matrix may be disposed in a peripheral region of the first substrate structure 100 to serve as a guide line defining a region in which a plurality of pixels P are disposed. The black matrix is not limited to a black color, and may have other colors, such as white or green, depending on the purpose and use of the product, and a transparent matrix may be used if necessary.

FIG. 19 illustrates a cross-sectional structure of one pixel P illustrated in FIG. 18 taken along II-II'. Referring to FIGS. 18 and 19, each pixel P may include first to third sub-pixels SP1, SP2, and SP3 configured to emit light of different colors. The first to third sub-pixels SP1, SP2, and SP3 included in each pixel P may be provided as a structure disposed adjacent to each other. The first to third sub-pixels SP1, SP2, and SP3 may be configured to provide different colors, so that a color image can be expressed on a display device 1. For example, the first to third sub-pixels SP1, SP2, and SP3 will be provided as sub-pixels emitting lights of red (R), green (G), and blue (G) colors, respectively. In an example embodiment, a form in which three sub-pixels respectively emitting RGB light are included in one pixel P, is illustrated, but is not limited thereto, and four or more sub-pixels may also be included. In addition, although an example has been described in which three sub-pixels are disposed side by side with each other as an example, the disposition of the sub-pixels may be variously modified.

Referring to FIGS. 18 and 19, one pixel P may include a first substrate structure 100 and a second substrate structure 300 stacked in an up and down direction (vertical). The first substrate structure 100 and the second substrate structure 300 may be bonded to each other by a bonding layer 200. A protective layer 400 may be bonded above the first substrate structure 100. The first substrate structure 100 and the second substrate structure 300 may be bonded to each other at a wafer level by a wafer bonding method such as fusion bonding to be integrated.

First to third nitride semiconductor light emitting devices 10R, 10G, and 10B may be disposed on the first substrate structure 100. The first to third nitride semiconductor light emitting devices 10R, 10G, and 10B of an example embodiment respectively have the same structure as the nitride semiconductor light emitting device 10 in FIG. 2, but there is a difference in which the substrate 110 of FIG. 2 is removed. The specific configuration of the nitride semiconductor light emitting device 10 will be described with reference to FIG. 2. Other configurations are the same as those of the nitride semiconductor light emitting device 10 described above, and thus detailed descriptions thereof are omitted.

The first to third nitride semiconductor light emitting devices 10R, 10G, and 10B may include first and second electrodes 180' and 190' for applying power, respectively.

The first substrate structure 100 may include a molding portion 101 exposing the first and second electrodes 180' and 190' while wrapping lower surfaces of the first to third nitride semiconductor light emitting devices 10R, 10G, and 10B. The molding portion 101 may include light reflective particles for reflecting light. Titanium dioxide ($TiO_2$) or aluminum oxide ($Al_2O_3$) may be used as the light reflective particles, but embodiments are not limited thereto.

A protective layer 400 may be disposed above the first substrate structure 100.

A bonding layer 200 for bonding to the second substrate structure 300 may be disposed below the first substrate structure 100. The bonding layer 200 may include an insulating bonding layer 210 and conductive bonding layers 210N and 210P.

The insulating bonding layer 210 may bond the first substrate structure 100 and the second substrate structure 300 to each other. The insulating bonding layer 210 may be made of a material having the same composition as the molding portion 101 of the first substrate structure 100. The conductive bonding layers 210N and 210P may be for bonding the first and second electrodes 180' and 190' of the second substrate structure 300 to electrodes of the second substrate structure 300, and may be made of a conductive material having the same composition as the second electrodes 180' and 190'. Accordingly, the first substrate structure 100 and the second substrate structure 300 may be bonded to each other through the bonding layer 200 to be integrated.

The second substrate structure 300 may include a driving circuit including a plurality of TFT cells for controlling the first to third nitride semiconductor light emitting devices 10R, 10G, and 10B of the first substrate structure 100, respectively. The plurality of TFT cells can constitute a TFT circuitry for controlling driving of the plurality of pixels P. The plurality of TFT cells may be connected to correspond to the first to third nitride semiconductor light emitting devices 10R, 10G, and 10B, respectively, through the conductive bonding layers 210N and 210P of the bonding layer 200. The plurality of TFT cells may include a semiconductor layer formed by implanting impurities into a semiconductor substrate. For example, the semiconductor layer constituting the plurality of TFT cells may include a semiconductor oxide such as polysilicon, a silicon-based semiconductor, and indium gallium zinc oxide, or a compound semiconductor such as silicon germanium.

As set forth above, according to an example embodiment, a nitride semiconductor light emitting device and a display device using the same may have an effect in which a time require to manufacture it is reduced, and a light emitting device package employing the nitride semiconductor device and the display device are easily miniaturized.

Various and advantageous advantages and effects of embodiments the present disclosure are not limited to the above description.

While the example embodiments have been shown and described above, it will be apparent to those skilled in the art that modifications and variations could be made without departing from the scope of the appended claims.

What is claimed is:

1. A nitride semiconductor light emitting device comprising:
   a semiconductor laminate comprising a first conductivity-type semiconductor layer including a first portion and a second portion protruding from an upper surface of the first portion, and a lattice buffer layer disposed on the second portion of the first conductivity-type semiconductor layer and comprising InGaN layers and GaN layers that are alternately stacked, the semiconductor laminate having a first surface corresponding to a lower surface of the first conductivity-type semiconductor layer and a second surface opposed to the first surface and exposing the upper surface of the first portion of the first conductivity-type semiconductor layer, each of the first surface and the second surface extending in a horizontal direction, the semiconductor laminate having a body portion comprising the second portion of the first conductivity-type semiconductor layer and the lattice buffer layer and having a columnar shape, and extending from the second surface in a vertical direction;
   an insulating layer covering the second surface, a side portion of the body portion, and a portion of a top of the lattice buffer layer and having an opening at an upper surface of the body portion, wherein the insulating layer is a single layer; and
   a light emitting structure comprising:
      a second conductivity-type semiconductor layer disposed on the upper surface of the body portion, the second conductivity-type semiconductor layer being a selective growth on the lattice buffer layer and having a side surface inclined with respect to the upper surface of the body portion,
      an active layer covering the second conductivity-type semiconductor layer and directly contacting the insulating layer, and
      a third conductivity-type semiconductor layer covering the active layer and directly contacting the insulating layer,
   wherein the active layer and the third conductivity-type semiconductor layer are conformally disposed according to a surface profile of the second conductivity-type semiconductor layer, and
   wherein a portion of the insulating layer covering the portion of the top of the lattice buffer layer is exposed from the third conductivity-type semiconductor layer.

2. The nitride semiconductor light emitting device of claim 1, wherein the active layer is configured to emit red light in a wavelength of 600 nm to 700 nm.

3. The nitride semiconductor light emitting device of claim 1, wherein the insulating layer has a region overlapping the upper surface of the body portion.

4. The nitride semiconductor light emitting device of claim 3, wherein the third conductivity-type semiconductor layer contacts the insulating layer only within the region overlapping the upper surface of the body portion.

5. The nitride semiconductor light emitting device of claim 1, wherein the first conductivity-type semiconductor layer includes a material having a same composition as the second conductivity-type semiconductor layer.

6. The nitride semiconductor light emitting device of claim 5, wherein the first conductivity-type semiconductor layer and the second conductivity-type semiconductor layer include n-GaN,
   wherein the active layer includes InGaN, and
   wherein the third conductivity-type semiconductor layer includes p-GaN.

7. The nitride semiconductor light emitting device of claim 6, wherein the side surface of the second conductivity-type semiconductor layer is a semi-polar surface.

8. The nitride semiconductor light emitting device of claim 7, wherein the side surface of the second conductivity-type semiconductor layer has an inclination angle of 55° to 65° with respect to the upper surface of the body portion.

9. The nitride semiconductor light emitting device of claim 1, wherein, viewed from in the vertical direction from the second surface, the body portion is disposed in a center of the semiconductor laminate.

10. The nitride semiconductor light emitting device of claim 1, wherein the body portion has a shape of a cylindrical column or a shape a polygonal column.

11. The nitride semiconductor light emitting device of claim 1, wherein the body portion has a shape of a hexagonal column, and
each side surface of the hexagonal column is a crystal plane of the lattice buffer layer.

12. A nitride semiconductor light emitting device comprising:
a semiconductor laminate comprising a first conductivity-type semiconductor layer including a first portion and a second portion protruding from an upper surface of the first portion and a lattice buffer layer disposed on the first portion of the first conductivity-type semiconductor layer and having a body portion comprising the second portion of the first conductivity-type semiconductor layer and the lattice buffer layer;
an insulating layer covering an upper surface of the semiconductor laminate where the first conductivity-type semiconductor layer is exposed, a side surface of the body portion, and a portion of an upper surface of the body portion, the insulating layer having an opening at the upper surface of the body portion, wherein the insulating layer is a single layer; and
a light emitting structure comprising:
a second conductivity-type semiconductor layer disposed on the upper surface of the body portion, the second conductivity-type semiconductor layer being a selective growth on the lattice buffer layer through the opening of the insulating layer and having a side surface inclined with respect to the upper surface of the body portion,
an active layer covering the second conductivity-type semiconductor layer and contacting the insulating layer, and
a third conductivity-type semiconductor layer covering the active layer and contacting the insulating layer,
wherein the active layer is configured to emit a red light in a wavelength range of 600 nm to 700 nm,
wherein the active layer and the third conductivity-type semiconductor layer are conformally disposed according to a surface profile of the second conductivity-type semiconductor layer,
wherein a portion of the insulating layer covering the portion of the top of the lattice buffer layer is exposed from the third conductivity-type semiconductor layer, and
wherein the insulating layer covering the portion of the top of the lattice buffer layer is in direct contact with:
i) a p-GaN layer of the light emitting structure, the p-GaN layer being the third conductivity-type semiconductor layer, ii) the active layer of the light emitting structure, and iii) an n-GaN layer of the light emitting structure, the n-GAN layer being the second conductivity-type semiconductor layer.

13. The nitride semiconductor light emitting device of claim 12, wherein the first conductivity-type semiconductor layer and the second conductivity-type semiconductor layer include n-GaN,
wherein the active layer includes InGaN,
wherein the third conductivity-type semiconductor layer includes p-GaN, and
wherein the side surface of the second conductivity-type semiconductor layer is a semi-polar surface.

14. The nitride semiconductor light emitting device of claim 12, wherein, in the lattice buffer layer, an InGaN layer and a GaN layer are alternately stacked.

15. A display device comprising:
a display panel comprising a circuit board and a plurality of pixels arranged in rows and columns on the circuit board; and
a panel driving unit configured to drive the display panel,
wherein each pixel of the plurality of pixels comprises:
a plurality of nitride semiconductor light emitting devices, each nitride semiconductor light emitting device of the plurality of nitride semiconductor light emitting devices comprising:
a semiconductor laminate comprising a first conductivity-type semiconductor layer including a first portion and a second portion protruding from an upper surface of the first portion, and a lattice buffer layer disposed on the second portion of the first conductivity-type semiconductor layer and comprising InGaN layers and GaN layers that are alternately stacked, the semiconductor laminate having a first surface corresponding to a lower surface of the first conductivity-type semiconductor layer and a second surface opposed to the first surface and exposing the upper surface of the first portion of the first conductivity-type semiconductor layer, each of the first surface and the second surface extending in a horizontal direction, the semiconductor laminate having a body portion comprising the second portion of the first conductivity-type semiconductor layer and the lattice buffer layer and having a columnar shape extending from the second surface in a vertical direction;
an insulating layer covering the second surface and having an opening at an upper surface of the body portion, wherein the insulating layer is a single layer; and
a light emitting structure comprising:
a second conductivity-type semiconductor layer disposed on the upper surface of the body portion, the second conductivity-type semiconductor layer being a selective growth on the lattice buffer layer and having a side surface inclined with respect to the upper surface of the body portion,
an active layer covering the second conductivity-type semiconductor layer and directly contacting the insulating layer, and
a third conductivity-type semiconductor layer covering the active layer and directly contacting the insulating layer, the plurality of nitride semiconductor light emitting devices constituting a plurality of sub-pixels of each pixel;
a molding portion surrounding each side surface of the plurality of nitride semiconductor light emitting devices such that the plurality of nitride semiconductor light emitting devices are coupled; and
a first electrode and a second electrode connected to the first conductivity-type semiconductor layer and the third conductivity-type semiconductor layer, respectively, the first electrode and the second electrode penetrating through the molding portion,
wherein the active layer and the third conductivity-type semiconductor layer are conformally disposed according to a surface profile of the second conductivity-type semiconductor layer, and wherein a portion of the insulating layer covering the portion of the top of the lattice buffer layer is exposed from the third conductivity-type semiconductor layer.

16. The display device of claim 15, wherein the plurality of nitride semiconductor light emitting devices comprise a first nitride semiconductor light emitting device, a second nitride semiconductor light emitting device, and a third nitride semiconductor light emitting device constituting each pixel,
wherein the first nitride semiconductor light emitting device comprises a first active layer, the second nitride semiconductor light emitting device comprises a second active layer, and the third nitride semiconductor light emitting device comprises a third active layer, and
wherein each of the first active layer, the second active layer, and the third active layer is configured to emit light having a different wavelength.

17. The display device of claim 16, wherein the first active layer, the second active layer, and the third active layer emit red light, green light, and blue light, respectively.

18. The display device of claim 15, wherein the plurality of nitride semiconductor light emitting devices are spaced apart from each other.

19. The display device of claim 15, wherein the lattice buffer layer has a thickness of at least $1/10$ of a width of a sub-pixel of the plurality of sub-pixels.

20. The display device of claim 15, wherein each pixel has a density of at least 5000 pixels per inch (PPI).

* * * * *